(12) United States Patent
Li et al.

(10) Patent No.: US 10,592,408 B2
(45) Date of Patent: Mar. 17, 2020

(54) APPARATUS, COMPUTER PROGRAM PRODUCT, SYSTEM, AND METHOD FOR MANAGING MULTIPLE REGIONS OF A MEMORY DEVICE

(71) Applicant: INTEL CORPORATION, Santa Clara, CA (US)

(72) Inventors: Peng Li, Hillsboro, OR (US); Sanjeev N. Trika, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 55 days.

(21) Appl. No.: 15/703,907

(22) Filed: Sep. 13, 2017

(65) Prior Publication Data

US 2019/0079859 A1 Mar. 14, 2019

(51) Int. Cl.
*G06F 12/02* (2006.01)
*H04L 29/08* (2006.01)
*G11C 16/34* (2006.01)
*G11C 13/00* (2006.01)

(52) U.S. Cl.
CPC ........ *G06F 12/0246* (2013.01); *G11C 16/349* (2013.01); *G11C 16/3495* (2013.01); *H04L 67/1095* (2013.01); *G06F 2212/7211* (2013.01); *G11C 13/0004* (2013.01); *H04L 67/322* (2013.01)

(58) Field of Classification Search
CPC combination set(s) only.
See application file for complete search history.

(56) References Cited

U.S. PATENT DOCUMENTS

| 9,448,922 | B2 | 9/2016 | Trika et al. | |
| 10,114,581 | B1* | 10/2018 | Natanzon | G06F 3/065 |
| 2003/0037214 | A1* | 2/2003 | Voigt | G06F 3/0601 |
| | | | | 711/170 |
| 2013/0262810 | A1* | 10/2013 | Chang | G06F 12/0246 |
| | | | | 711/170 |

OTHER PUBLICATIONS

"CSE 451: Operating Systems Section 8", [online], [Retrieved on Feb. 11, 2017]. Retrieved from the Internet at <URL: https://courses.cs.washington.edu/courses/cse451/15wi/sections/section8.pdf>, Total 16 pp.

(Continued)

*Primary Examiner* — Yong J Choe
(74) *Attorney, Agent, or Firm* — Konrad Raynes Davda & Victor LLP; David W. Victor

(57) ABSTRACT

Provided are an apparatus, computer program product, system, and method for managing multiple regions of a non-volatile memory device. A first group of logical bands is assigned to a first memory region in which metadata will be stored and a second group of logical bands is assigned to a second memory region to which host data is written, wherein the second group of logical bands is larger than the first group of logical bands. Physical bands are mapped to the first number of logical bands and the second number of logical bands. Indication is returned to the host system of the first and second groups of logical bands assigned to the first and second memory regions, respectively. The host system directs requests for metadata to logical addresses in the first group of logical bands and directs request for file data to logical addresses in the second group of logical bands.

21 Claims, 7 Drawing Sheets

(56) References Cited

OTHER PUBLICATIONS

Poirier, D., "The Second Extended File System", [online], [Retrieved on Mar. 14, 2017]. Retrieved from the Internet at <URL: http://www.nongnu.org/ext2-doc/ext2.html>, Copyright © 2001-2011, Total 31 pp.

Rusling, D.A., "Chapter 9: The File System", [online], [Retrieved on Feb. 9, 2017]. Retrieved from the Internet at <URL: http://www.tldp.org/LDP/tlk/fs/filesystem.html#tth_sEc9.1.4>, © 1996-1999 David A Rusling, Total 17 pp.

Wikipedia, "ext2", [online], [Retrieved on Mar. 14, 2017]. Retrieved from the Internet at <URL: https://en.wikipedia.org/wiki/Ext2>, last modified on Feb. 16, 2017, Total 4 pp.

Wikipedia, "inode", [online], [Retrieved on Mar. 14, 2017]. Retrieved from the Internet at <URL: https://en.wikipedia.org/wiki/Inode>, last modified on Nov. 14, 2016, Total 3 pp.

U.S. Appl. No. 15/460,043, entitled "A Storage System, Computer Program Product, and Method for Managing a Hybrid Memory Device System", invented by P. Li, et al., filed Mar. 15, 2017, 44 pp. [77.386 (Appln)].

* cited by examiner

File Metadata

Logical Band Assignments

Logical Band Indirection Table Entry

Device Managed Region Indirection Table Entry

APPARATUS, COMPUTER PROGRAM PRODUCT, SYSTEM, AND METHOD FOR MANAGING MULTIPLE REGIONS OF A MEMORY DEVICE

TECHNICAL FIELD

Embodiments described herein generally relate to an apparatus, computer program product, system, and method for managing multiple regions of a memory device.

BACKGROUND

Conventional file systems maintain non-volatile information and data structures used to manage the file system in a storage device that is to remain persistent. The data structures and information maintained may include a superblock comprising overall metadata, such as file system type, size, status, and information about other metadata structures; inodes which comprises the structure that holds metadata for a given file (e.g., permissions, timestamps), length, and location of its constituent blocks, and, if needed, location of the file's next inode; an inode bitmap used to manage free space for inodes, where each bit specifies whether the corresponding space on the storage device (pre-reserved at filesystem creation time) is free; and data blocks comprising the actual data of the files and directories in the file system, where each file and directory may have multiple data blocks; and a data block bitmap used to indicate free space for data blocks.

BRIEF DESCRIPTION OF THE DRAWINGS

Embodiments are described by way of example, with reference to the accompanying drawings, which are not drawn to scale, in which like reference numerals refer to similar elements.

DESCRIPTION OF EMBODIMENTS

Figure 1:
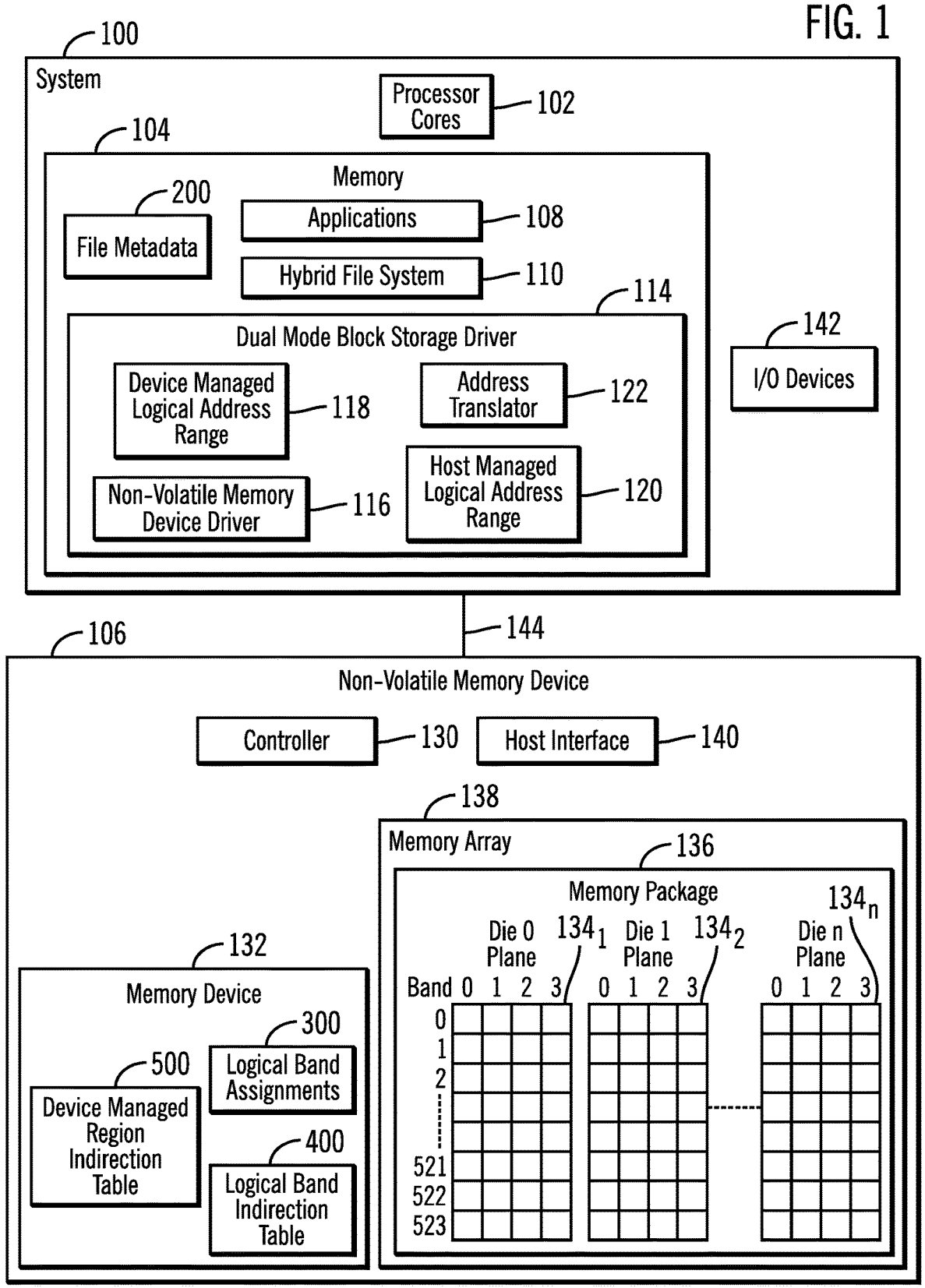
FIG. 1 illustrates an embodiment of a system including a hybrid memory device system.

The file system in a host system performs operations with respect to logical addresses that are translated to physical addresses in the storage device in which the file system metadata and data blocks are stored. When the file system metadata is stored in a NAND storage device, such as a solid state storage drive (SSD), the file system communicates file read and write requests to the inodes and file and directory data blocks having inode data, stored in the SSD using logical addresses. The SSD maintains a logical-to-physical address (L2P) lookup table or Flash Translation Table (FLT) in a memory device of the SSD, such as a Dynamic Random Access Memory (DRAM).

Further, in NAND memory devices, such as SSDs, when overwriting data or metadata, the new data or metadata is written to a new free data block in a copy-on write procedure where the original data in the block to update (or overwrite) is copied into a free data block and then the original data is modified with the new write data in the few free data block. The data in the original data block is now stale or invalid.

To perform a file system operation to write a single block of a file, the following operations are performed: (1) a read-modify-write (RMW) to the file system inode bitmap once; (2) a RMW to the file system data block bitmap once; (3) a RMW to the file's inode once; (4) a RMW to the inode of the file's directory once; and (5) a write to the data block once. Further, each RMW operation to an existing inode or data block in an SSD or NAND device requires the copy-on write procedure. Yet further, most of these file system writes to file system metadata are small, single-sector writes.

There is a need in the art for improved techniques for managing file system data and metadata, and performing read and write operations to distinguish between metadata and file system data.

As discussed above, file system operations when block based memory is used result in a large number of single sector file system writes to the block based storage to update directory and file metadata. On some common workloads, these single sector writes are 50% plus of the data writes. On SSDs, such workloads result in a very high read-modify-write (RMW) overhead, since NAND page sizes are large (e.g., 16 kilobytes (KB)), resulting in up to 32 times performance and endurance overhead for these approximate 50% of writes. The impact is exacerbated by write-amplification introduced on the SSD due to the random-write nature of these small writes (another 2-10 times increase in writes).

NAND based SSDs also require the use of the L2P and FTL tables that are typically maintained in byte addressable volatile memory, such as DRAM in the SSD, requiring approximately 1 MB of DRAM per GB of NAND capacity. This introduces a cost overhead for SSDs that may comprise a significant portion of the cost of the SSD. There are also cost overheads for capacitors and higher-processor requirements associated with the SSD algorithms, especially related to L2P management, defragmentation and power-loss-recovery (PLR). Further, indirection in the SSD using the indirection tables, e.g., L2P and FTT tables, requires significant processor resources to perform indirection, defragmentation, and power-loss-recovery (PLR) algorithms, which significantly increases SSD complexity.

Described embodiments provide techniques to improve the performance of file system operations when a non-volatile memory device performing copy-on write operations is used, such as an SSD, by providing dual mode memory regions, a device managed memory region comprising smaller sized blocks for metadata and a host managed memory region having larger sized blocks for storing file data. The device managed memory region may be substantially smaller in byte size than the host sized memory region because it is limited to storing file metadata, not the file data. By placing file metadata in a memory region having a smaller block size to accommodate the smaller sized writes for metadata, the amount of NAND pages and blocks involved in the copy-on-write process is reduced by allowing for more fine grained writes.

Further, with described embodiments, an indirection table is only provided for the device managed memory region and not the much larger host managed memory region. Host system writes to the host managed memory region to logical addresses may be mapped using a logical band indirection table, which includes a limited number of entries, one for each logical band and corresponding physical band in the memory array. In this way, there is no need to provide indirection table entries for the much larger host managed memory region. Further, the device managed memory region indirection table and the logical band indirection table take up a fraction of the space that would otherwise be required of a full indirection table for the entire memory space, up to just 5% of the memory space. This means that the non-volatile memory device, such as SSD, may require a much smaller memory device, such as a Dynamic Random Access Memory (DRAM), resulting in substantial cost savings to manufacture the non-volatile memory device.

Described embodiments provide techniques to perform wear levelling of the physical bands between the device managed and host managed memory regions. The physical bands in the device managed memory regions storing metadata receive substantially more writes than the host managed region storing file data. Thus, described embodiments provide wear leveling to move physical bands being used for logical bands in the more heavily used device managed memory region to the lessor used host managed memory region.

In the following description, numerous specific details such as logic implementations, opcodes, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Certain embodiments relate to storage device electronic assemblies. Embodiments include both devices and methods for forming electronic assemblies.

FIG. 1 illustrates an embodiment of a system 100 having one or more processor cores 102 and a system memory 104. The system 100 may utilize a non-volatile memory device 106. The system memory 104 includes one or more applications 108 issuing requests to create, write, modify and read files maintained by a hybrid file system 110. The hybrid file system 110 maintains file metadata 200 providing metadata on files and directories configured in the hybrid file system 110. The file metadata 200 is stored in the non-volatile memory device 106, as well as a working copy in the system memory 104. In certain embodiments, the file/directory metadata 200 may comprise inode data structures. In alternative file system embodiments, different metadata data structures may be used. A directory inode may identify a data block in at which directory information is maintained, such as next level, child sub-directories from the directory and files in the directory identified by the directory inode. A file inode may identify file data blocks used to store the file data. An inode, which comprises file metadata, holds the metadata for a file or directory (e.g., permissions, timestamps), length, and location of its constituent blocks, and, if needed, location of the directory or files next inode. The term inode as used herein refers to any type of file or directory metadata.

The system memory 114 has a dual mode block storage driver 114 to manage access to the non-volatile memory device 106. The dual mode block storage driver 114 includes a non-volatile memory device driver 116 to interface with the non-volatile memory device 106. During system 100 initialization, the dual mode block storage driver 114 discovers a device managed logical address range 118 and a host managed logical address range 120. The dual mode block storage driver 114 presents a single contiguous logical address space based on the logical addresses available in the address ranges 118 and 120. The dual mode block storage driver 114 further includes an address translator 128 to select logical addresses in the device managed logical address range 118 to use for file metadata and select logical addresses in the host managed logical address range 120 to use for file data.

The non-volatile memory device 106 includes a controller 130 to manage I/O requests and perform device management operations, such as garbage collection, wear leveling, etc. The controller 130 accesses information in a memory device 132, including logical band region assignments 300, a logical band indirection table 400, and a device managed region indirection table 500. The band region assignments 300 indicate groups of logical bands assigned to the device managed region and the host managed region, which assignment may be made by non-volatile settings in the controller 130 that are default set by the manufacturer or configured by the dual mode block storage driver 114. The logical band indirection table 400 provides a mapping of logical bands to the physical bands configured across storage dies $134_1$, $134_2 \ldots 134_n$ in a memory package 136 of a memory array 138 of the non-volatile memory device 106. The size of the logical band indirection table 400 is not large, usually at most 500 to a couple thousand entries, limited to the number of physical bands in the memory array 136.

The non-volatile memory device 106 further includes a host interface 140 to connect the non-volatile memory device 106 to a system 100 when the memory device 106 comprises an SSD. The non-volatile memory device 106 may be installed or embedded within an enclosure including the system 100 or the non-volatile memory device 106 may be external to the system 100 as shown in FIG. 1. The host interface 140 may comprise a bus interface, such as a Peripheral Component Interconnect Express (PCIe) interface, Serial AT Attachment (SATA), Non-Volatile Memory Express (NVMe), etc.

FIG. 1 shows the memory array 138 as comprised of a plurality of one or more memory packages 136, each memory package 136 having a plurality storage dies $134_1$, $134_2 \ldots 134_n$, where each die is comprised of a plurality of bands and planes forming the addressable blocks, such that a band extends across planes in multiple dies. Logical and physical addresses map to a band, plane and die. Each band, e.g., bands 0 . . . 523, comprises a row of blocks extending across a row of blocks on the planes 0, 1, 2, 3 on dies 0 . . . n, where each plane is comprised of columns of blocks that extend through the bands, which comprise rows of blocks on the planes. Different embodiments may have more or less memory packages, dies, bands and planes than shown in FIG. 1.

In certain embodiments, the dual mode block storage driver 114 only assigns logical address in the device managed logical address range 118 for file metadata 200, e.g., inodes, and assigns logical address, comprising a logical band and offset in the band, in the host managed logical address range 120 for file data blocks. In one embodiment, the block size of blocks in the device managed logical address range may be smaller than the block size of blocks in the host managed logical address range 120. This allows finer granularity for writes to metadata, which require much less space than file data, and typically comprise smaller and more frequent writes than the writes to the file data. This allows file metadata operations to minimize the number of blocks or logical addresses that are written to by tailoring the block size to the size of a metadata block.

For instance, the block size of blocks at logical address in the device managed address range 118 may be 4 KB, 512 B or smaller, and the block size of blocks in the host managed region 120 may be larger than those in the device managed region 118.

In certain embodiments, the number of logical bands assigned to the device managed region are substantially fewer than those assigned to the host managed region. For instance, the device managed region for storing metadata may be just 1% of the host managed region, and comprise just a small fraction of the physical bands. For instance, for a 16 terabyte (TB) non-volatile memory device, such as an SSD, the device managed region may comprise 16 gigabytes (GB) and the host managed region 15.84 TB. Further, because the device managed region indirection table 500 is for a much smaller number of logical addresses, the indirection table, or logical-to-physical mapping, will have far fewer entries than an indirection table having a logical address for every logical address in the memory array 138. Because the device managed region indirection table 500 is substantially smaller than an indirection table for the entire address space, a smaller memory device 132 may be used, such as a Dynamic Random Access Memory (DRAM), than current SSD devices that have an indirection table with entries for the entire memory array space, which significantly reduces the cost of manufacturing the non-volatile memory device 106.

By way of a non-limiting example, in an embodiment with a 16 TB storage space in the non-volatile memory array 138, the device managed region may comprise 16 GB of space ("DR_size") and the host managed region 15.84 TB. If the entries or indirection units (IUs) in the device managed region indirection table 500 have a size of 4 B (IU_entry_size) and the size of each block in the device managed region is 64 B ("IU granularity"), then the memory in the memory device 132 required for this indirection table 500 is:

(IU_entry_size*(DR_size/IU_granularity))=(4 B*(16 GB/64 B))=1 GB.

This size of the reduced indirection table 500 may be 6% of the memory space in the memory device 132 required for an indirection table for the entire address space. This allows the use of a substantially less capacity memory device 132, e.g., DRAM, in the non-volatile memory device 106, than used in a standard SSD of this size.

In the embodiment of FIG. 1, the dual mode block storage driver 114 is shown as implemented in the system 100. In alternative embodiments, some or all of the operations described with respect to the dual mode block storage driver 114 components may be implemented in the non-volatile memory device 106.

The hybrid file system 110 may issue file system read and write requests and requests to allocate data blocks in the device managed logical address range 118 and host managed logical address range 120. The non-volatile memory device driver 116 may then translate those commands into memory device specific commands. In certain embodiment, the non-volatile memory device is a copy-on write system that has to perform multiple copy operations for copy-on write to allocate a new data block for the updated data and invalidate the previous data block having the previous version of the data being updated.

The system may further include Input/Output (I/O) devices 142, such as input controls (e.g., keyboards, mice, touch screen), display monitors, storage devices, etc.

The non-volatile memory device 106 may communicate with the system 100 over a common interface 144, such as a Peripheral Component Interconnect Express (PCIe) bus or other type of bus or interface or separate interfaces.

In certain embodiment, the non-volatile memory device 106 may be comprised of a of block addressable non-volatile memories for example, dies (e.g., single level cell (SLC), multi-level cell (MLC), triple level cell (TLC) NAND memories, etc.).

The memory devices 104 and 132 may be comprised of a byte addressable write-in-place memory such as a three-dimensional (3D) Xpoint (crosspoint) memory, phase change memory (PCM), memory that incorporates memristor technology, Magnetoresistive random-access memory (MRAM), Spin Transfer Torque (STT)-MRAM, SRAM storage devices, DRAM, a ferroelectric random-access memory (FeTRAM), nanowire-based non-volatile memory, and a Non-Volatile Direct In-Line Memory Modules (DIMMs) with byte-addressable write-in-place memory, etc.

Figure 2:
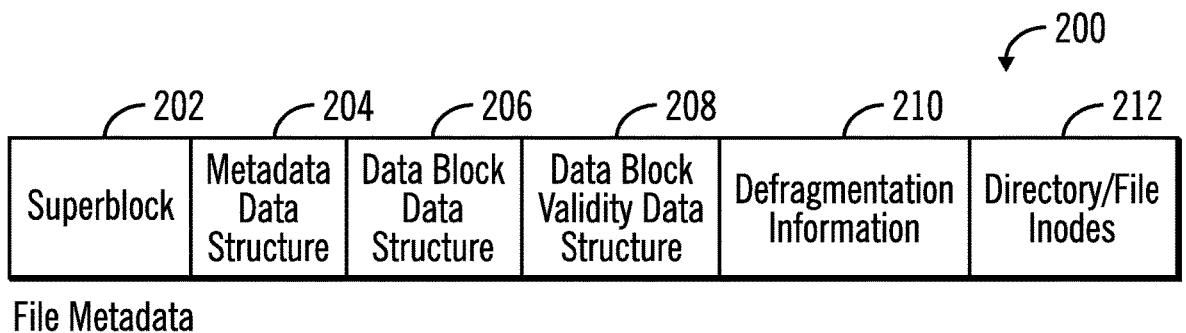
FIG. 2 illustrates an embodiment of file metadata.

FIG. 2 illustrates an embodiment of the file system metadata 200 as including a superblock 202 providing overall metadata, such as the file system type, size, status, and information about other metadata structures; a metadata data structure 204, such as a bitmap, including an indicator for each metadata block in the non-volatile memory device 106 indicating whether the data block is free or used; a data block data structure 206, such as a bitmap, including an indicator for each data block in the non-volatile memory device 106 indicating whether the data block is free or used; a data block validity data structure 208, such as a bitmap, including an indicator for each data block in the non-volatile memory device 106 indicating whether the data block has valid or invalid data; defragmentation information 210 on data blocks in the second memory device 108 to use to determine which data blocks to defragment, such as invalid block count, erase cycles count, etc.; and the directory and file inodes (i.e., metadata) 212.

The defragmentation information 210 and data block validity data structure 208 are used in embodiments where the non-volatile memory device 106 is a copy-on write device where data is always written to a blank page or data block. The data blocks that are updated with new data written to a new location are marked as invalid and eligible for defragmentation to free the data blocks having the stale data.

Figure 3:
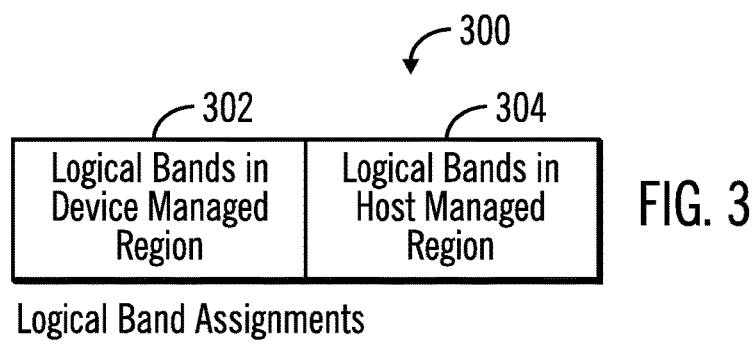
FIG. 3 illustrates an embodiment of logical band assignments.

FIG. 3 illustrates an embodiment of the logical band assignments as including logical bands in the device managed region 302 and logical bands in the host managed region 304, where the logical bands in the device managed region 302 may comprise a small fraction of the number in the host managed region 304.

Figure 4:
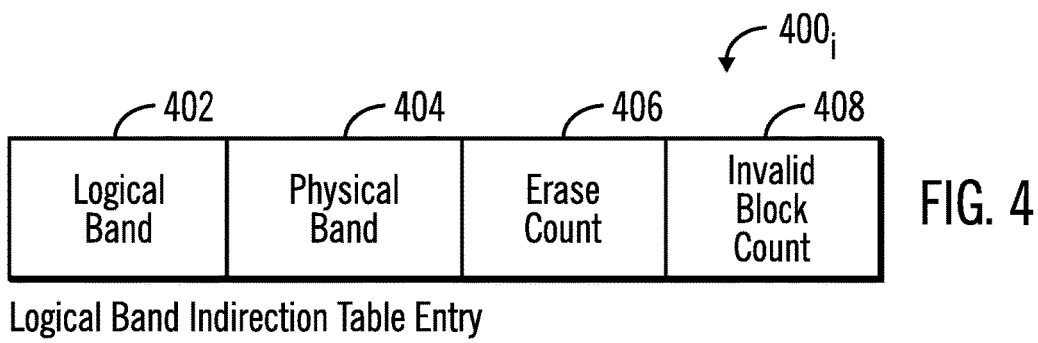
FIG. 4 illustrates an embodiment of a logical band indirection table entry.

FIG. 4 illustrates an embodiment of an entry $400_i$ in the logical band indirection table 400, and includes a logical band 402, a physical band 404 assigned to the logical band; a program/erase cycles count 406 performed with respect to the block addresses in in the physical band 404 mapping to the logical band 402; and an invalid block count 508 indicating a number of invalid blocks in the physical band 404 mapping to the logical band 402. The logical band indirection table 400 allows physical bands to be dynamically assigned to logical bands, such as when the physical bands are changed for garbage collection or wear leveling.

Figure 5:
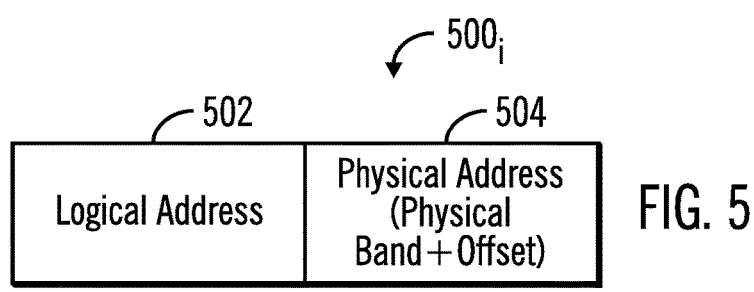
FIG. 5 illustrates an embodiment of a device managed region indirection table entry.

FIG. 5 illustrates an embodiment of an entry 500, in the device managed region indirection table 500, as including a logical address 502 and a physical address 504, such as a physical band and offset in the band. Because logical addresses 502 in the device managed region have a finer granularity, or are smaller, than the block size of blocks in the host managed region, there would be more offsets used for the logical addresses that map to one physical band, i.e., more logical addresses per physical band in the device managed region than the host managed region.

Information as described in the data structures of FIGS. 2-5 may be maintained in a different format than shown, with more or less information than shown.

Figure 6:
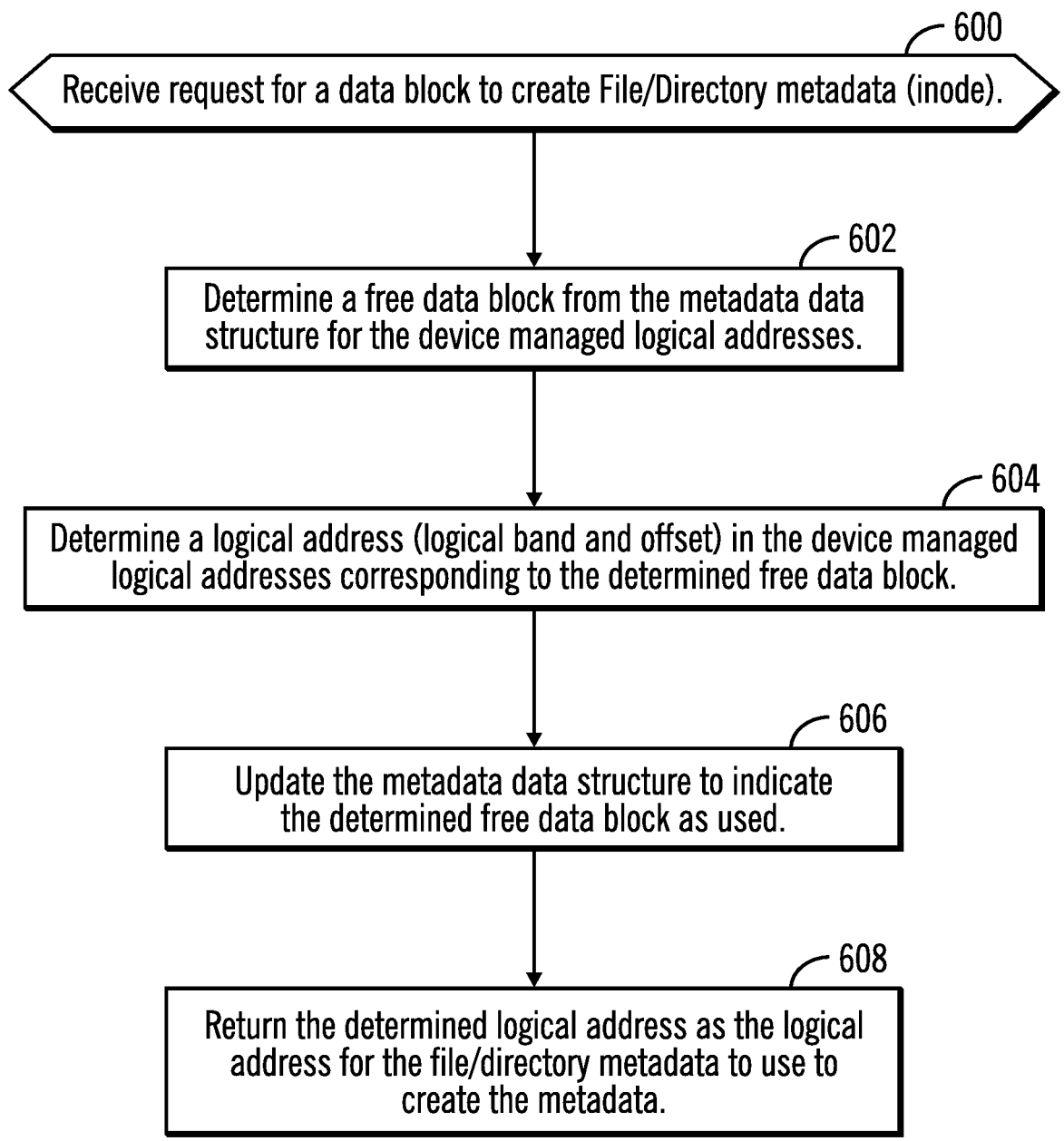
FIG. 6 illustrates an embodiment of operations to process a request for a data block to create a file/directory metadata, such as an inode.

FIG. 6 illustrates an embodiment of operations performed by the address translator 122 in the dual mode block storage driver 114 in response to receiving a request for a data block to create file/directory metadata 212, such as an inode. Upon receiving the request, the address translator 122 determines (at block 602) a free data block from the metadata data structure 204 in the device managed logical address range 118. The address translator 122 determines (at block 604) a logical address in the device managed logical address range 188 that corresponds to the determined free data block 138 from the metadata data structure 204 and updates (at block 606) the metadata data structure 204 to indicate the determined free data block as used for the file/directory inode 212 to create. The address translator 122 returns (at block 608) the determined logical address as the logical address for the hybrid file system 112 to use to create the file/directory inodes 212.

With the operations of FIG. 6, the address translator 126 of the dual mode block storage driver 114 selects logical addresses to use for metadata 200 from the device managed logical address range 118, which provide smaller block size data blocks more suitable for metadata than file data.

Figure 7:
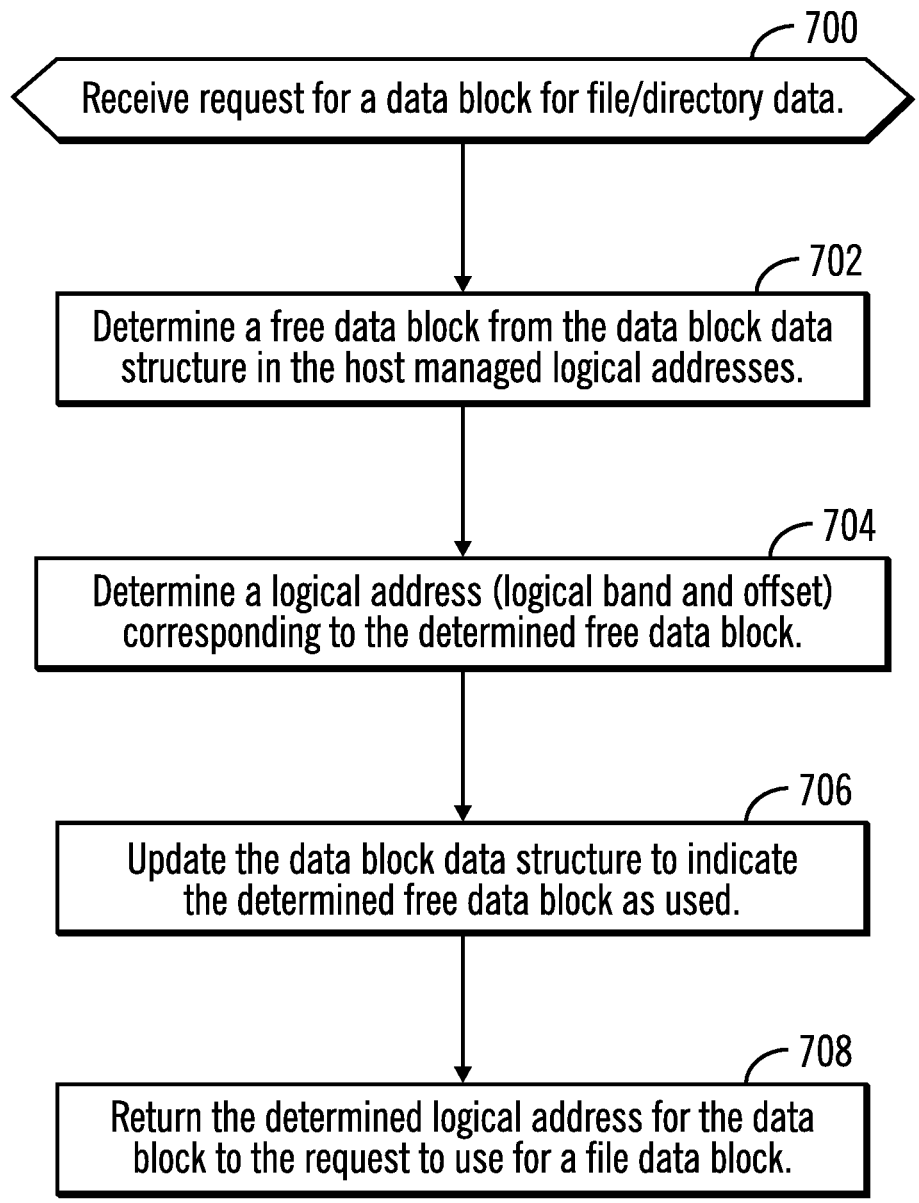
FIG. 7 illustrates an embodiment of operations to process a request for a data block for file data.

FIG. 7 illustrates an embodiment of operations performed by the address translator 122 of the dual mode block storage driver 114 in response to receiving a request for a data block to allocate for file data for a file/directory inodes 212 or for a file to store file data. Upon receiving (at block 700) the request, the address translator 122 determines (at block 702) a free data block in the host managed logical address range 120 from the data block data structure 206. The address translator 122 determines (at block 704) a logical address in the host managed logical address range 120 that corresponds to the determined free data block from the data block data structure 206 and updates (at block 706) the data block data structure 206 to indicate the determined free data block 138 as used. The address translator 126 returns (at block 708) the determined logical address in the host managed logical address range 120 for the hybrid file system 112 to use for the data block for the file or the file/directory inode 212.

With the operations of FIGS. 6 and 7, the address translator 126 may select a logical address to use from different device managed 118 and host managed 120 regions, where the different regions have different block sizes.

Figure 8:
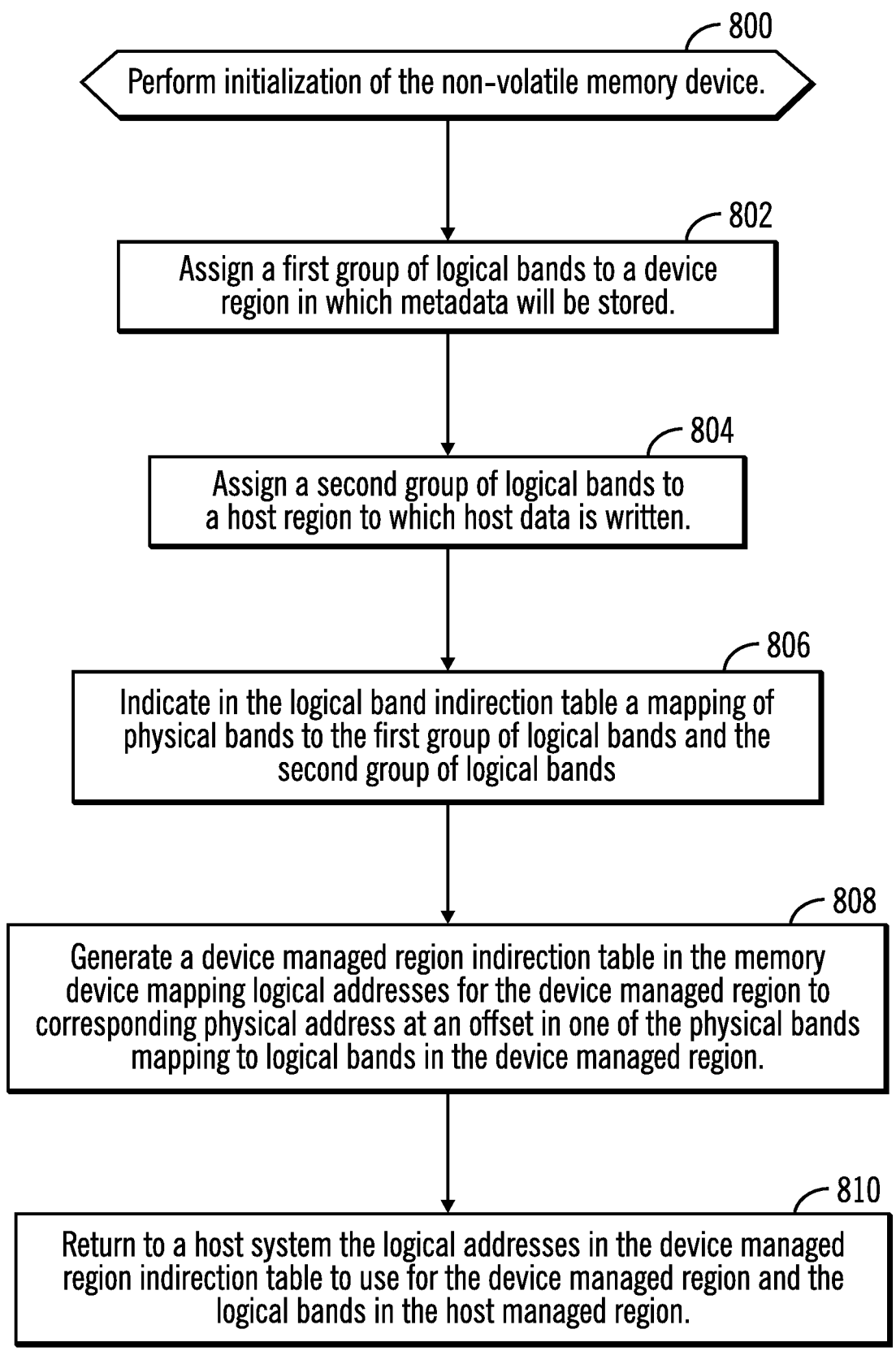
FIG. 8 illustrates an embodiment of operations to initialize memory regions in a non-volatile memory device.

FIG. 8 illustrates an embodiment of operations performed by the controller 130 in the non-volatile memory device to initialize the data structures 300, 400, and 500 in the memory device 132. Upon performing an initialization (at block 800) of the non-volatile memory device 106, such as after it is formatted and first installed in a system, the controller 130 assigns (at block 802) a first group of logical bands to a device managed region 302, also referred to as a first memory region, to store metadata and assigns (at block 804) a second group of logical bands to a host managed region 304, also referred to as a second memory region, to which host data is written. These assignments may be set by default by the manufacturer and later configured by the user through the dual mode block storage driver 114. The controller 130 indicates (at block 806) in the logical band indirection table 400 a mapping of physical bands 404 to the logical bands 402 in the device managed region 302, a first group of logical bands, and the logical bands in the host managed region 304, a second group of logical bands. The erase count 408 and invalid block count 408 may be initialized to zero.

The controller 130 generates (at block 808) a device managed region indirection table 500 in the memory device 132 mapping logical addresses for the device managed region to corresponding physical address at an offset in one of the physical bands mapping to the logical bands in the device managed region 302. The controller 130 may return (at block 810) to the host system 100 the logical addresses in the device managed region indirection table 500 to use for the device managed region and the logical bands in the host managed region 304. In alternative embodiment, the controller 130 may return a range of logical addresses for the host managed region 304 for the dual mode block storage driver 114 to use.

Figure 9:
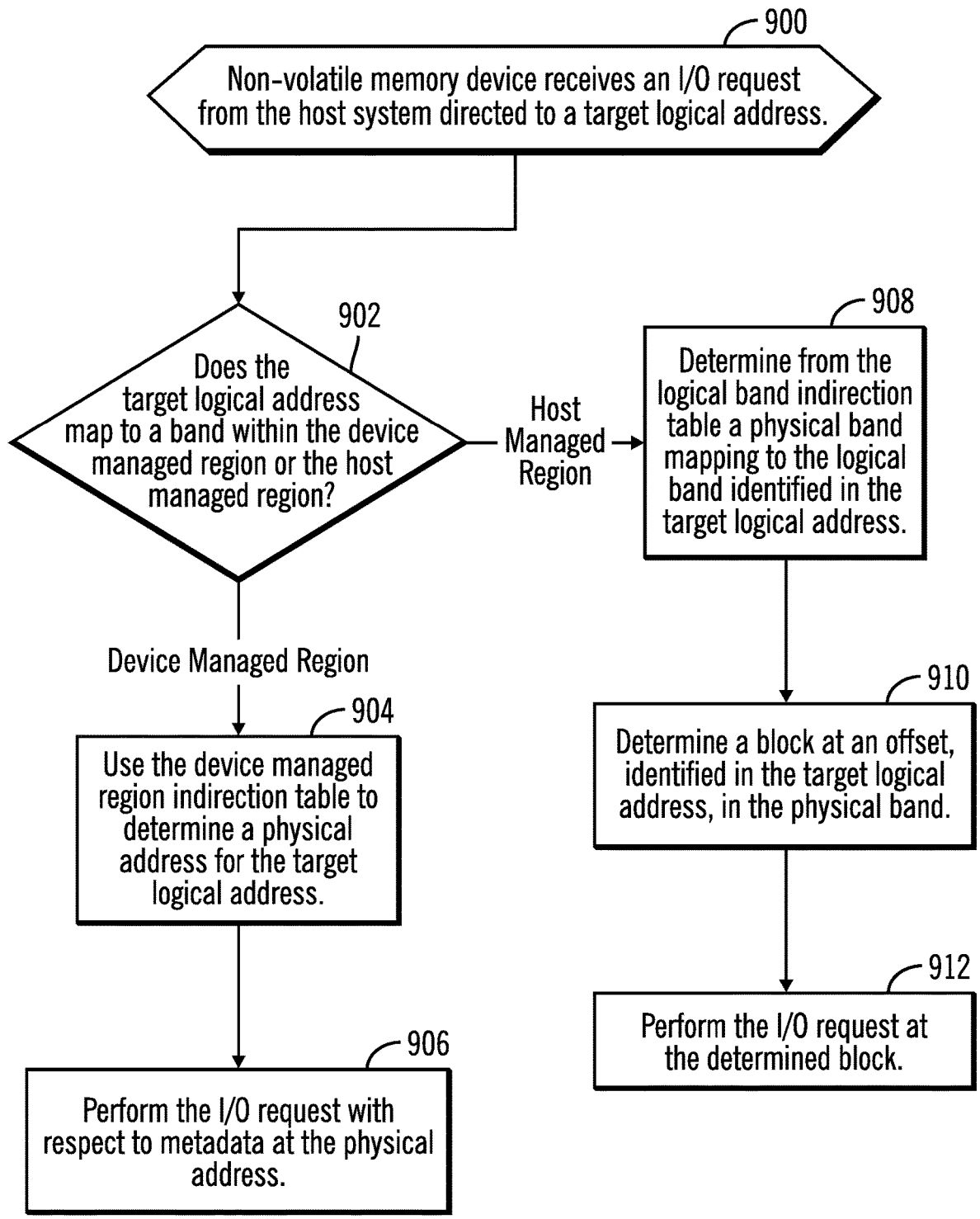
FIG. 9 illustrates an embodiment of operations to process an Input/Output (I/O) request in a non-volatile memory device.

FIG. 9 illustrates an embodiment of operations performed by the controller 130 in the non-volatile memory device 106 to process an I/O request to a target logical address. Upon receiving (at block 900) the I/O request, the controller 130 determines (at block 902) whether the target logical address maps to a logical band within the device managed region 302 or the host managed region 304. If (at block 902) the target logical address maps to the device managed region 302, then the controller 130 uses (at block 904) the device managed region indirection table 500 to determine a physical address 504 for the target logical address 502. The controller 130 performs (at block 906) the I/O request, e.g., read or write, with respect to metadata at the physical address 504.

If (at block 902) the target logical address maps to a band within the host managed region 304, then the controller 130 determines (at block 908) from the logical band indirection table 400, in an entry $400_i$, a physical band 404 mapping to the logical band 402 identified in the target logical address. A block is determined (at block 910) at an offset, identified in the target logical address, in the physical band 404. The I/O request is performed (at block 912) with respect to the file data at the determined block.

With the embodiment of FIG. 9, the memory controller 130 uses an indirection table for logical addresses assigned to the device managed region 302 and directly maps logical addresses in the host managed region 304 to the physical addresses without the need for an indirection table. Avoiding the need for indirection table entries for the host managed region 304, which is where most the memory space is maintained, substantially reduces the indirection table size needed for only logical addresses in the device managed region. This allows for use of a smaller memory device 132, e.g., DRAM, in the non-volatile memory device 106, substantially reducing the cost of manufacture of the non-volatile memory device 106 than if an indirection table for the entire address space was provided. The logical band indirection table 400 contains a limited number of entries, one for each physical band, far less than the number of entries used for each logical address in the host managed region 304.

Figure 10:
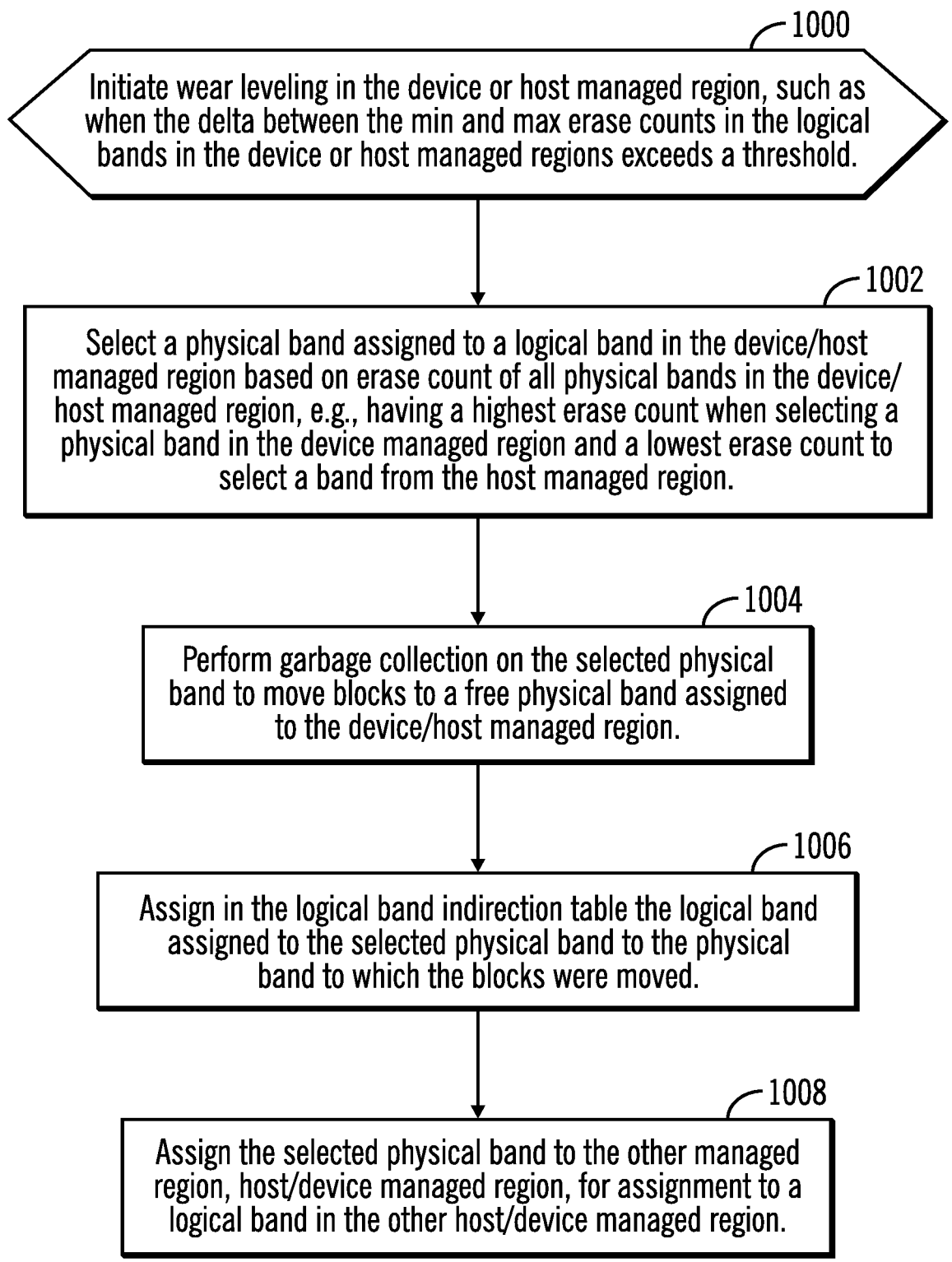
FIG. 10 illustrates an embodiment of operations to perform wear leveling for physical bands in the non-volatile memory device.

FIG. 10 illustrates an embodiment of operations performed by the controller 130 to initiate wear levelling to move physical bands between the host managed and device managed regions because physical bands assigned in the device managed region likely experience substantially more writes than the physical bands assigned to the logical bands in the host managed region 304. Thus, the operations of FIG. 10 are to move bands between the regions to provide for wear levelling between the more heavily written device managed region versus less accessed host managed region. The operations of FIG. 10 may be performed to transfer physical bands between both device managed and host managed regions. Further, the wear leveling for the host managed or device managed region may be performed when a delta or difference of the maximum erase count and minimum erase count in a host managed or device managed region exceeds a threshold.

Upon initiating a wear leveling (at block 1000), the controller 130 selects (at block 1002) a physical band 404 (FIG. 4) assigned to a logical band 402 in the device/host managed region selected for wear leveling based on erase counts 406 of all physical bands 404 in the device/host managed region. For instance, if wear levelling is being performed in the device managed region, then the physical band 404 having a highest erase count 406 may be selected, whereas in the host managed region, a physical band 404 having a lowest erase count 406 may be selected to move to the other region. The controller 130 then performs (at block 1004) garbage collection on the selected physical band to move blocks to a free physical band assigned to the device/host managed region selected for wear leveling. The controller 130 assigns (at block 1006), in the logical band indirection table 300, the logical band 302 assigned to the selected band 304 to the physical band to which blocks were moved. The selected physical band is then available to be assigned (at block 1008) to a logical band in the other device managed or host managed region.

With the embodiments of FIG. 10, physical bands are transferred between the device managed and host managed region to ensure workload balancing on the physical bands because the workload toward metadata 200 stored in the logical bands in the device managed region 302 experiences substantially more writes than the workload toward file data to the logical bands in the host managed region 304.

Described embodiments improve file system performance by using a dual mode block storage driver 114 that stores file metadata and file data in different regions of logical bands in the non-volatile memory device 106. Using a device managed region having logical addresses with smaller sized blocks is more efficient than using the same block size for metadata and file data because accesses of metadata involve more frequent access to smaller blocks of data than the access profile to file data blocks. Further, described embodiments provide improvement to the manufacture of the non-volatile memory device 106 by substantially reducing the size of the indirection table to only provide indirection mapping for the much smaller device managed region of logical addresses. Reducing the size of the indirection table, reduces the size of the memory in the non-volatile memory device 106 needed to manage the memory space in the memory array 138.

The described embodiments may be implemented as a method, apparatus, device, and computer program product comprising a computer readable storage medium using standard programming and/or engineering techniques to produce software, firmware, hardware, or any combination thereof. The described operations may be implemented as code or logic maintained in a "computer readable storage medium". The term "code" as used herein refers to software program code, hardware logic, firmware, microcode, etc. The computer readable storage medium, as that term is used herein, includes a tangible element, including at least one of electronic circuitry, integrated circuit dies, storage materials, a casing, a housing, a coating, and hardware. A computer readable storage medium may comprise, but is not limited to, a magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), Solid State Devices (SSD), computer encoded and readable punch cards, etc. The computer readable storage medium may further comprise a hardware device implementing firmware, microcode, etc., such as in an integrated circuit chip, a programmable logic device, a Programmable Gate Array (PGA), field-programmable gate array (FPGA), Application Specific Integrated Circuit (ASIC), etc. Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The program code embedded on a computer readable storage medium may be transmitted as transmission signals from a transmitting station or computer to a receiving station or computer.

A computer readable storage medium is not comprised solely of transmission signals, but includes physical and tangible components. Those skilled in the art will recognize that many modifications may be made to this configuration without departing from the scope of the present invention, and that the article of manufacture may comprise suitable information bearing medium known in the art.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

The reference characters used herein, such as i and n, are used herein to denote a variable number of instances of an element, which may represent the same or different values, and may represent the same or different value when used with different or the same elements in different described instances.

EXAMPLES

Example 1 is an apparatus to receive read and write requests from a host system, comprising: a plurality of storage dies; and a controller to: assign a first group of logical bands to a first memory region in which metadata will be stored; assign a second group of logical bands to a second memory region to which host data is written, wherein the second group of logical bands is larger than the first group of logical bands; indicate a mapping of physical bands in the storage dies to the first group of logical bands and the second group of logical bands; and return, to the host system, indication of the first group of logical bands for the first memory region and the second group of logical bands for the second memory region, wherein the host system directs requests for metadata to logical addresses in the first group of logical bands and directs request for file data to logical addresses in the second group of logical bands.

In Example 2, the subject matter of Examples 1 and 3-10 can optionally include that blocks stored at logical addresses in the first group of logical bands have a first block size, wherein blocks stored at logical addresses in the second group of logical bands have a second block size, wherein the second block size is larger than the first block size, wherein a physical band comprises storage blocks extending across the storage dies, and wherein blocks in the physical band are identified by offsets within the physical band.

In Example 3, the subject matter of Examples 1, 2 and 4-10 can optionally include a memory device to include: a logical band indirection table that provides a mapping of logical bands to physical bands; and an address indirection table providing a mapping of logical addresses for the first memory region to corresponding physical addresses at offsets in the physical bands mapping to the logical bands in the first group of logical bands.

In Example 4, the subject matter of Examples 1-3 and 5-10 can optionally include that the controller is further to: receive an Input/Output (I/O) request from the host system directed to a target logical address identifying a logical band and an offset within the logical band; determine whether the target logical address identifies a logical band within the first group or the second group of logical bands; and use the address indirection table to determine a physical address for the target logical address in the I/O request from the mapping of logical addresses to corresponding physical addresses in response to a determination that the target logical address identifies a logical band within the first group of logical bands.

In Example 5, the subject matter of Examples 1-4 and 6-10 can optionally include the controller is further to: in response to a determination that the target logical address identifies a logical band within the second group of logical bands, perform: determine, from the logical band indirection table, a physical band mapping to the logical band identified by the target logical address; and perform the I/O request with respect to a block at the offset in the determined physical band.

In Example 6, the subject matter of Examples 1-5 and 7-10 can optionally include that a first storage space size of the first group of logical bands is not more than one percent of a second storage space size of the second group of logical bands.

In Example 7, the subject matter of Examples 1-6 and 8-10 can optionally include the controller is further to: provide an erase count indicating a number of program erase/cycles to blocks in a physical band assigned to a logical band; select a first physical band assigned to a first logical band from the logical bands in the first memory region based on erase counts of the logical bands in the first memory region; perform garbage collection on the first physical band to move used blocks in the first physical band to a second physical band; assign, in a mapping of logical bands to physical bands, the first logical band to the second physical band; and assign, in the mapping of logical bands to physical bands, the first physical band to a logical band in the second memory region.

In Example 8, the subject matter of Examples 1-7 and 9-10 can optionally include that the controller is further to: select a third physical band assigned to a second logical band in the second memory region based on erase counts of the logical bands in the second memory region; perform garbage collection on the third physical band to move used blocks in the third physical band to a fourth physical band; assign, in the mapping of logical bands to physical bands, the second logical band to the fourth physical band; and assign, in the mapping of logical bands to physical bands, the third physical band to a logical band in the first memory region.

In Example 9, the subject matter of Examples 1-8 and 10 can optionally include that to select the first physical band based on the erase counts comprises selecting one of the physical bands assigned to a logical band in the first memory region having a highest erase count, and wherein to select the third physical band comprises selecting one of the physical bands assigned to a logical band in the second memory region having a lowest erase count.

In Example 10, the subject matter of Examples 1-9 can optionally include that the plurality of storage dies comprise NAND dies and wherein the apparatus comprises a non-volatile memory device.

Example 11 is a computer program product comprising a computer readable storage medium including a computer program executed by a processor and in communication with a non-volatile memory device, wherein the computer program is executed to: receive from the non-volatile memory device a first group of logical bands for a first memory region in which metadata will be stored and a second group of logical bands for a second memory region to which file blocks are written, wherein the second group of logical bands is larger than the first group of logical bands; determine a first available offset in a first logical band in the first group of logical bands to store file metadata in a file system; and determine an available offset in a second logical band in the second group of logical bands for a file block to store file data in the file system.

In Example 12, the subject matter of Examples 11, 13, and 14 can optionally include that the computer program is further executed to: send a first write request to a first address identifying the determined first available offset in the first logical band to write metadata for a file in the file system; and send a second write request to a second address identifying the determined second available offset in the second logical band to write file data for the file in the file system.

In Example 13, the subject matter of Examples 11, 12 and 14 can optionally include that metadata for files in the file system is only allocated to offsets in logical bands in the first group of logical bands and wherein data blocks for the file data in the file system are only allocated to offsets in logical bands in the second group of logical bands.

In Example 14, the subject matter of Examples 11-13 can optionally include that metadata blocks stored at logical addresses in the first group of logical bands are for blocks having a first block size and wherein file data blocks stored at logical addresses in the second group of logical bands have a second block size, wherein the second block size is larger than the first block size.

Example 15 is a system, comprising: a host system; and a non-volatile memory device in communication with the host system, comprising: a plurality of storage dies; a controller to: assign a first group of logical bands to a first memory region in which metadata will be stored; assign a second group of logical bands to a second memory region to which host data is written, wherein the second group of logical bands is larger than the first group of logical bands; indicate a mapping of physical bands in the storage dies to the first group of logical bands and the second group of logical bands; and return, to the host system, indication of the first group of logical bands for the first memory region and the second group of logical bands for the second memory region, wherein the host system directs requests for metadata to logical addresses in the first group of logical bands and directs request for file data to logical addresses in the second group of logical bands.

In Example 16, the subject matter of Examples 15 and 17-19 can optionally include that blocks stored at logical addresses in the first group of logical bands have a first block size, wherein blocks stored at logical addresses in the second group of logical bands have a second block size, wherein the second block size is larger than the first block size, wherein a physical band comprises storage blocks extending across the storage dies, and wherein blocks in the physical band are identified by offsets within the physical band.

In Example 17, the subject matter of Examples 15, 16 and 18-19 can optionally include that the non-volatile memory device further includes a memory device comprising: a logical band indirection table that provides a mapping of logical bands to physical bands; and an address indirection table mapping logical addresses for the first memory region to corresponding physical addresses at offsets in the physical bands mapping to the logical bands in the first group of logical bands.

In Example 18, the subject matter of Examples 15-17 and 19 can optionally include that the host system is further to: receive from the non-volatile memory device a first group of logical bands for a first memory region in which metadata will be stored and a second group of logical bands for a second memory region to which file blocks are written, wherein the second group of logical bands is larger than the first group of logical bands; determine a first available offset in a first logical band in the first group of logical bands to store file metadata in a file system; and determine an available offset in a second logical band in the second group of logical bands for a file block to store file data in the file system.

In Example 19, the subject matter of Examples 15-18 can optionally include that the host system is further to: send a first write request to a first address identifying the determined first available offset in the first logical band to write metadata for a file in the file system; and send a second write request to a second address identifying the determined second available offset in the second logical band to write file data for the file in the file system.

Example 20 is a method for assigning addresses in a non-volatile memory device comprised of a plurality of storage dies, comprising: assigning a first group of logical bands to a first memory region in which metadata will be stored; assigning a second group of logical bands to a second memory region to which host data is written, wherein the second group of logical bands is larger than the first group of logical bands; indicating a mapping of physical bands in the storage dies to the first group of logical bands and the second group of logical bands; and returning, to a host system, indication of the first group of logical bands for the first memory region and the second group of logical bands for the second memory region, wherein the host system directs requests for metadata to logical addresses in the first group of logical bands and directs request for file data to logical addresses in the second group of logical bands.

In Example 21, the subject matter of Examples 20 and 22-25 can optionally include that blocks stored at logical addresses in the first group of logical bands have a first block size, wherein blocks stored at logical addresses in the second group of logical bands have a second block size, wherein the second block size is larger than the first block size, wherein a physical band comprises storage blocks extending across the storage dies, and wherein blocks in the physical band are identified by offsets within the physical band.

In Example 22, the subject matter of Examples 20, 21 and 23-25 can optionally include providing a logical band indirection table that provides a mapping of logical bands to physical bands; and providing an address indirection table mapping logical addresses for the first memory region to corresponding physical addresses at offsets in the physical bands mapping to the logical bands in the first group of logical bands.

In Example 23, the subject matter of Examples 20-22 and 24-25 can optionally include receiving an Input/Output (I/O) request from the host system directed to a target logical address identifying a logical band and an offset within the logical band;
determining whether the target logical address identifies a logical band within the first group or the second group of logical bands; and using the address indirection table to determine a physical address for the target logical address in the I/O request in response to a determination that the target logical address identifies a logical band within the first group of logical bands.

In Example 24, the subject matter of Examples 20-23 25 can optionally include in response to a determination that the target logical address identifies a logical band within the second group of logical bands: determining, from the logical band indirection table, a physical band mapping to the logical band identified by the target logical address; and performing the I/O request with respect to a block at the offset in the determined physical band.

In Example 25, the subject matter of Examples 20-24 can optionally include providing an erase count indicating a number of program erase/cycles to blocks in a physical band assigned to a logical band; selecting a first physical band assigned to a first logical band from the logical bands in the first memory region based on erase counts of the logical bands in the first memory region; performing garbage collection on the first physical band to move used blocks in the first physical band to a second physical band; assigning, in a mapping of logical bands to physical bands, the first logical band to the second physical band; and assigning, in the mapping of logical bands to physical bands, the first physical band to a logical band in the second memory region.

Example 26 is a system in communication with a non-volatile memory device, comprising: a processor executing computer program code in a system memory device to: receive from the non-volatile memory device a first group of logical bands for a first memory region in which metadata will be stored and a second group of logical bands for a second memory region to which file blocks are written, wherein the second group of logical bands is larger than the first group of logical bands; determine a first available offset in a first logical band in the first group of logical bands to store file metadata in a file system; and determine an available offset in a second logical band in the second group of logical bands for a file block to store file data in the file system.

In Example 27, the subject matter of Examples 26, 28, and 29 can optionally include that the processor further executes to: send a first write request to a first address identifying the determined first available offset in the first logical band to write metadata for a file in the file system; and send a second write request to a second address identifying the determined second available offset in the second logical band to write file data for the file in the file system.

In Example 28, the subject matter of Examples 26, 27, and 29 can optionally include that metadata for files in the file system is only allocated to offsets in logical bands in the first group of logical bands and wherein data blocks for the file data in the file system are only allocated to offsets in logical bands in the second group of logical bands.

In Example 29, the subject matter of Examples 26, 27, and 28, can optionally include that metadata blocks stored at logical addresses in the first group of logical bands are for blocks having a first block size and wherein file data blocks stored at logical addresses in the second group of logical bands have a second block size, wherein the second block size is larger than the first block size.

Example 30 is an apparatus for assigning addresses in a non-volatile memory device comprised of a plurality of storage dies, comprising: means for assigning a first group of logical bands to a first memory region in which metadata will be stored; means assigning a second group of logical bands to a second memory region to which host data is written, wherein the second group of logical bands is larger than the first group of logical bands; means for indicating a mapping of physical bands in the storage dies to the first group of logical bands and the second group of logical bands; and means for returning, to a host system, indication of the first group of logical bands for the first memory region and the second group of logical bands for the second memory region, wherein the host system directs requests for metadata to logical addresses in the first group of logical bands and directs request for file data to logical addresses in the second group of logical bands.

Example 31 is a machine-readable storage including machine-readable instructions, when executed, to implement a method or realize an apparatus as claimed in any preceding claim.

What is claimed:

1. An apparatus to receive read and write requests from a host system, comprising:
   a plurality of storage dies;
   a controller to:
      assign a first group of logical bands to a first memory region in which metadata is to be stored;
      assign a second group of logical bands to a second memory region to which host data is written, wherein the second group of logical bands is larger than the first group of logical bands;
      indicate a mapping of physical bands in the storage dies to the first group of logical bands and the second group of logical bands; and
      return, to the host system, indication of the first group of logical bands for the first memory region and the second group of logical bands for the second memory region, wherein the host system directs requests for metadata to logical addresses in the first group of logical bands and directs request for file data to logical addresses in the second group of logical bands.

2. The apparatus of claim 1, wherein blocks stored at logical addresses in the first group of logical bands have a first block size, wherein blocks stored at logical addresses in the second group of logical bands have a second block size, wherein the second block size is larger than the first block size, wherein a physical band comprises storage blocks extending across the storage dies, and wherein blocks in the physical band are identified by offsets within the physical band.

3. The apparatus of claim 1, further comprising:
   a memory device to include:
   a logical band indirection table that provides a mapping of logical bands to physical bands; and
   an address indirection table providing a mapping of logical addresses for the first memory region to corresponding physical addresses at offsets in the physical bands mapping to the logical bands in the first group of logical bands.

4. The apparatus of claim 3, wherein the controller is further to:
   receive an Input/Output (I/O) request from the host system directed to a target logical address identifying a logical band and an offset within the logical band;
   determine whether the target logical address identifies a logical band within the first group or the second group of logical bands; and
   use the address indirection table to determine a physical address for the target logical address in the I/O request from the mapping of logical addresses to corresponding physical addresses in response to a determination that the target logical address identifies a logical band within the first group of logical bands.

5. The apparatus of claim 4, wherein the controller is further to:
   in response to a determination that the target logical address identifies a logical band within the second group of logical bands, perform:
   determine, from the logical band indirection table, a physical band mapping to the logical band identified by the target logical address; and
   perform the I/O request with respect to a block at the offset in the determined physical band.

6. The apparatus of claim 1, wherein a first storage space size of the first group of logical bands is not more than one percent of a second storage space size of the second group of logical bands.

7. The apparatus of claim 1, wherein the controller is further to:
provide an erase count indicating a number of program erase/cycles to blocks in a physical band assigned to a logical band;
select a first physical band assigned to a first logical band from the logical bands in the first memory region based on erase counts of the logical bands in the first memory region;
perform garbage collection on the first physical band to move used blocks in the first physical band to a second physical band;
assign, in a mapping of logical bands to physical bands, the first logical band to the second physical band; and
assign, in the mapping of logical bands to physical bands, the first physical band to a logical band in the second memory region.

8. The apparatus of claim 7, wherein the controller is further to:
select a third physical band assigned to a second logical band in the second memory region based on erase counts of the logical bands in the second memory region;
perform garbage collection on the third physical band to move used blocks in the third physical band to a fourth physical band;
assign, in the mapping of logical bands to physical bands, the second logical band to the fourth physical band; and
assign, in the mapping of logical bands to physical bands, the third physical band to a logical band in the first memory region.

9. The apparatus of claim 8, wherein to select the first physical band based on the erase counts comprises selecting one of the physical bands assigned to a logical band in the first memory region having a highest erase count, and wherein to select the third physical band comprises selecting one of the physical bands assigned to a logical band in the second memory region having a lowest erase count.

10. The apparatus of claim 1, wherein the plurality of storage dies comprise NAND dies and wherein the apparatus comprises a non-volatile memory device.

11. A system, comprising:
a host system; and
a non-volatile memory device in communication with the host system, comprising:
a plurality of storage dies;
a controller to:
assign a first group of logical bands to a first memory region in which metadata is to be stored;
assign a second group of logical bands to a second memory region to which host data is written, wherein the second group of logical bands is larger than the first group of logical bands;
indicate a mapping of physical bands in the storage dies to the first group of logical bands and the second group of logical bands; and
return, to the host system, indication of the first group of logical bands for the first memory region and the second group of logical bands for the second memory region, wherein the host system directs requests for metadata to logical addresses in the first group of logical bands and directs request for file data to logical addresses in the second group of logical bands.

12. The system of claim 11, wherein blocks stored at logical addresses in the first group of logical bands have a first block size, wherein blocks stored at logical addresses in the second group of logical bands have a second block size, wherein the second block size is larger than the first block size, wherein a physical band comprises storage blocks extending across the storage dies, and wherein blocks in the physical band are identified by offsets within the physical band.

13. The system of claim 11, wherein the non-volatile memory device further includes a memory device comprising:
a logical band indirection table that provides a mapping of logical bands to physical bands; and
an address indirection table mapping logical addresses for the first memory region to corresponding physical addresses at offsets in the physical bands mapping to the logical bands in the first group of logical bands.

14. The system of claim 11, wherein the host system is further to:
receive from the non-volatile memory device a first group of logical bands for a first memory region in which metadata is to be stored and a second group of logical bands for a second memory region to which file blocks are written, wherein the second group of logical bands is larger than the first group of logical bands;
determine a first available offset in a first logical band in the first group of logical bands to store file metadata in a file system; and
determine a second available offset in a second logical band in the second group of logical bands for a file block to store file data in the file system.

15. The system of claim 14, wherein the host system is further to:
send a first write request to a first address identifying the determined first available offset in the first logical band to write metadata for a file in the file system; and
send a second write request to a second address identifying the determined second available offset in the second logical band to write file data for the file in the file system.

16. A method for assigning addresses in a non-volatile memory device comprised of a plurality of storage dies, comprising:
assigning a first group of logical bands to a first memory region in which metadata is to be stored;
assigning a second group of logical bands to a second memory region to which host data is written, wherein the second group of logical bands is larger than the first group of logical bands;
indicating a mapping of physical bands in the storage dies to the first group of logical bands and the second group of logical bands; and
returning, to a host system, indication of the first group of logical bands for the first memory region and the second group of logical bands for the second memory region, wherein the host system directs requests for metadata to logical addresses in the first group of logical bands and directs request for file data to logical addresses in the second group of logical bands.

17. The method of claim 16, wherein blocks stored at logical addresses in the first group of logical bands have a first block size, wherein blocks stored at logical addresses in the second group of logical bands have a second block size, wherein the second block size is larger than the first block size, wherein a physical band comprises storage blocks extending across the storage dies, and wherein blocks in the physical band are identified by offsets within the physical band.

18. The method of claim 16, further comprising:
providing a logical band indirection table that provides a mapping of logical bands to physical bands; and
providing an address indirection table mapping logical addresses for the first memory region to corresponding physical addresses at offsets in the physical bands mapping to the logical bands in the first group of logical bands.

19. The method of claim 18, further comprising:
receiving an Input/Output (I/O) request from the host system directed to a target logical address identifying a logical band and an offset within the logical band;
determining whether the target logical address identifies a logical band within the first group or the second group of logical bands; and
using the address indirection table to determine a physical address for the target logical address in the I/O request in response to a determination that the target logical address identifies a logical band within the first group of logical bands.

20. The method of claim 19, further comprising:
in response to a determination that the target logical address identifies a logical band within the second group of logical bands:
determining, from the logical band indirection table, a physical band mapping to the logical band identified by the target logical address; and
performing the I/O request with respect to a block at the offset in the determined physical band.

21. The method of claim 16, further comprising:
providing an erase count indicating a number of program erase/cycles to blocks in a physical band assigned to a logical band;
selecting a first physical band assigned to a first logical band from the logical bands in the first memory region based on erase counts of the logical bands in the first memory region;
performing garbage collection on the first physical band to move used blocks in the first physical band to a second physical band;
assigning, in a mapping of logical bands to physical bands, the first logical band to the second physical band; and
assigning, in the mapping of logical bands to physical bands, the first physical band to a logical band in the second memory region.

* * * * *